United States Patent
Van Bommel

(10) Patent No.: US 12,085,238 B2
(45) Date of Patent: Sep. 10, 2024

(54) LED FILAMENT

(71) Applicant: SIGNIFY HOLDING B.V., Eindhoven (NL)

(72) Inventor: Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/562,939

(22) PCT Filed: May 17, 2022

(86) PCT No.: PCT/EP2022/063260
§ 371 (c)(1),
(2) Date: Nov. 21, 2023

(87) PCT Pub. No.: WO2022/248283
PCT Pub. Date: Dec. 1, 2022

(65) Prior Publication Data
US 2024/0218987 A1      Jul. 4, 2024

(30) Foreign Application Priority Data

May 26, 2021   (EP) .................................... 21176004

(51) Int. Cl.
*F21K 9/232*       (2016.01)
*F21K 9/68*        (2016.01)
(Continued)

(52) U.S. Cl.
CPC ................ *F21K 9/232* (2016.08); *F21K 9/68* (2016.08); *H01L 25/0753* (2013.01); *F21Y 2113/17* (2016.08); *F21Y 2115/10* (2016.08)

(58) Field of Classification Search
CPC ....... F21K 9/232; F21K 9/68; H01L 25/0753; F21Y 2113/17; F21Y 2115/10
See application file for complete search history.

(56) References Cited

U.S. PATENT DOCUMENTS 10,544,910 B2 *   1/2020   Pettmann .................. F21K 9/68
10,883,672 B1 *   1/2021   DeSena, Jr. ............... F21K 9/68
(Continued)

FOREIGN PATENT DOCUMENTS

WO      2020190960 A1    9/2020
WO      2020208009 A1   10/2020
(Continued)

*Primary Examiner* — Evan P Dzierzynski

(57) ABSTRACT

A light emitting diode, LED, filament (100) arranged to emit LED filament light is provided. The LED filament comprises a LED filament (110), elongating along an axis, A, comprising array(s) (120) of a plurality of LEDs (130) arranged to emit LED light (140), and an encapsulant (150) enclosing the array(s) of the LEDs, wherein the encapsulant comprises a light-transmissive material. The LED filament further comprises an elongated reflector (160) having a first reflectivity, R1, arranged to reflect the LED light, wherein the reflector, by partially enclosing a cross-section, CB, perpendicular to the axis, A, of the LED filament in a radial direction, R, partially encloses the encapsulant along the LED filament, whereby the reflector defines at least one opening (180) along the LED filament, wherein the encapsulant is not covered by the reflector along the at least one opening.

13 Claims, 6 Drawing Sheets

Fig. 3a

(51) Int. Cl.
*H01L 25/075* (2006.01)
*F21Y 113/17* (2016.01)
*F21Y 115/10* (2016.01)

(56) References Cited

U.S. PATENT DOCUMENTS

| | | | | |
|---|---|---|---|---|
| 2016/0020371 | A1* | 1/2016 | Kang | H01L 33/60 |
| | | | | 257/91 |
| 2017/0241598 | A1* | 8/2017 | Jiang | H01L 24/48 |
| 2018/0328543 | A1* | 11/2018 | Bergmann | H05B 45/3577 |
| 2019/0326480 | A1* | 10/2019 | You | H01L 33/50 |
| 2020/0303356 | A1 | 9/2020 | Li et al. | |

FOREIGN PATENT DOCUMENTS

| | | | |
|---|---|---|---|
| WO | 2020239655 | A1 | 12/2020 |
| WO | 2021053080 | A1 | 3/2021 |
| WO | 2021094257 | A1 | 5/2021 |

* cited by examiner

LED FILAMENT

CROSS-REFERENCE TO PRIOR APPLICATIONS

This application is the U.S. National Phase application under 35 U.S.C. § 371 of International Application No. PCT/EP2022/063260, filed on May 17, 2022, which claims the benefit of European Patent Application No. 21176004.6, filed on May 26, 2021. These applications are hereby incorporated by reference herein.

FIELD OF THE INVENTION

The present invention generally relates to a light emitting diode, LED, filament.

BACKGROUND OF THE INVENTION

The use of light emitting diodes, LEDs, for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

Many LED filament lamps or devices in the prior art comprise LED filaments which are able to produce warm white light. However, it is of interest to improve the properties of the light emitted from the LED filaments, including the color (temperature) of the light, without impairing the appearance and/or the decorative aspect of the LED filaments and/or the LED filament lamps.

Hence, it is an object of the present invention to improve the properties of the light emitted from the LED filaments, including the color (temperature) of the light, whilst providing a desired aesthetical appearance and/or decorative aspect of the LED filaments and/or the LED filament lamps.

SUMMARY OF THE INVENTION

It is of interest to explore the possibility of combining one or more of the numerous advantages of LED filaments comprising LEDs, whilst improving the properties of the light emitted from the LED filaments without impairing the appearance and/or the decorative aspect of the LED filaments and/or the LED filament lamps.

This and other objects are achieved by providing a LED filament having the features in the independent claim. Preferred embodiments are defined in the dependent claims.

Hence, according to the present invention, there is provided a LED filament arranged to emit LED filament light. The LED filament comprises an elongated axis, A. The LED filament comprises at least one array of a plurality of LEDs arranged to emit LED light, and an encapsulant enclosing the at least one array of the plurality of LEDs, wherein the encapsulant comprises a light-transmissive material. The LED filament further comprises an elongated reflector having a first reflectivity, $R_1$, arranged to reflect the LED light, wherein the reflector, by partially enclosing a cross-section, CB, perpendicular to the axis, A, of the LED filament in a radial direction, R, partially encloses the encapsulant along the LED filament, whereby the reflector defines at least one opening along the LED filament, wherein the encapsulant is not covered by the reflector along the at least one opening.

Thus, the present invention is based on the idea of providing a LED filament wherein the reflector partially encloses the encapsulant, which in turn encloses the array(s) of LEDs, such that the LED light emanates via opening(s) of the reflector along the LED filament. The LED filament hereby provides a light cavity. Hence, as the reflector encloses portion(s) of the encapsulant (and the LEDs) in one or more radial directions, whilst the reflector transmits LED light via its opening(s) wherein the reflector does not cover or enclose the encapsulant (and the LEDs) in one or more radial directions, the LED filament is able to provide a control of the color (temperature) of the light and to provide an aesthetically attractive appearance and/or decorative aspect of the LED filament.

The present invention is further advantageous in that the LED filament may achieve an appealing LED light emission via its features, such as a slim line LED light emission, an improved mixing of the LED light and/or less spottiness of the LED light compared to prior art arrangements.

The present invention is further advantageous in that the numerous advantages of using LED technology may be combined with the attractiveness and the appealing properties of the LED filament as disclosed.

The present invention is further advantageous in that the reflector defines a structure or pattern by enclosing portion(s) of the encapsulant (and the LEDs) in one or more radial directions, and transmitting the LED light via its opening(s), wherein this structure or pattern of the reflector contributes to the aesthetic attractiveness of the LED filament.

The present invention is further advantageous in that the LED filament of the present invention comprises relatively few components. The low number of components is advantageous in that the LED filament is relatively inexpensive to fabricate. Moreover, the low number of components of the LED filament implies an easier recycling, especially compared to devices or s comprising a relatively high number of components which impede an easy disassembling and/or recycling operation.

The LED filament lamp comprises a LED filament. The LED filament, in its turn, comprises at least one array of LEDs. By the term "array", it is here meant a linear arrangement or chain of LEDs, or the like, arranged on the LED filament(s). The LEDs may furthermore be arranged, mounted and/or mechanically coupled on/to a carrier or substrate of each LED filament, wherein the carrier or substrate is configured to support the LEDs. The LEDs are arranged to emit LED light, i.e. light emitted from the LEDs during operation.

The LED filament further comprises an encapsulant enclosing the at least one array of the plurality of LEDs, wherein the encapsulant comprises a light-transmissive material. By the term "encapsulant", it is here meant an elongated material, element, arrangement, or the like, which is configured or arranged to at least partially surround, encapsulate and/or enclose the array(s) of the plurality of LEDs of the LED filament(s). By the term "light-transmissive material", it is here meant a material, composition and/or substance which is configured to transmit (i.e. transfer) light.

The LED filament further comprises an elongated reflector having a first reflectivity, $R_1$, arranged to reflect the LED light. The reflector, by partially enclosing a cross-section, CB, perpendicular to the axis, A, of the LED filament in a radial direction, R, partially encloses the encapsulant along the LED filament, whereby the reflector defines at least one opening along the LED filament, wherein the encapsulant is not covered by the reflector along the at least one opening. Hence, the encapsulant, which in turn encloses the LED array(s), comprises (first) portion(s) which is (are) enclosed by the reflector along the LED filament, and further comprises (second) portion(s) which is (are) not enclosed (i.e. not covered) by the reflector along the LED filament due to the opening(s) of the reflector. In other words, the reflector is dispensed with material such that opening(s) is (are) provided.

According to an embodiment of the present invention, the LED filament may comprise at least one first array of a plurality of first LEDs configured to emit light with a first color temperature, $CT_1$, and at least one second array of a plurality of second LEDs configured to emit light with a second color temperature, $CT_2$, wherein $CT_1 \neq CT_2$. Preferably, $CT_2-CT_1 > 300$ K, more preferred $CT_2-CT_1 > 700$ K, and even more preferred $CT_2-CT_1 > 900$ K. Hence, the LEDs of the first array(s) may be configured to emit light with a first color temperature, $CT_1$, which is different from a second color temperature, $CT_2$, of light emitted by the LEDs of the second array(s). For example, the first color temperature, $CT_1$, may be relatively high, and the second color temperature, $CT_2$, may be relatively low. The present embodiment is advantageous in that the LED filament, via the difference in color temperature between its arrays of LEDs, may provide a desired color temperature of the LED filament light. The present embodiment is further advantageous in that the difference in color temperature between the arrays of LEDs may even further contribute to the aesthetical attractiveness of the LED filament during operation.

According to an embodiment of the present invention, at least one first array of a plurality of first LEDs may be configured to emit light with a first color temperature, $CT_1$, and at least one second array of a plurality of second LEDs may comprise a plurality of red LEDs, a plurality of green LEDs and a plurality of blue LEDs. Hence, the LEDs of the first array(s) may be configured to emit light with a first color temperature, $CT_1$, and the second array(s) may comprise so called RGB (red, green, blue) LEDs. The present embodiment is advantageous in that the LED filament may achieve an effectful emission of the LED filament light and achieve a decorative LED filament during operation.

According to an embodiment of the present invention, the at least one opening is an elongated opening arranged along at least a portion of a length of the LED filament. Hence, the elongated opening(s) of the elongated reflector are provided along the LED filament along the axis, A. The present embodiment is advantageous in that the form of the elongated opening(s) may even further contribute to the attractiveness of the LED filament light and/or desired properties of the LED light emission. For example, in case of a single (i.e. only one) elongated opening of the reflector, the LED filament may achieve a single side LED light emission.

According to an embodiment of the present invention, the reflector, by partially enclosing the cross-section, CB, of the encapsulant in the radial direction, R, and symmetric with respect to the radial direction, R, may define a first opening and a second opening, wherein the second opening is arranged opposite the first opening. Hence, the reflector partially encloses the cross-section, CB, of the encapsulant in the radial direction, R, and partially encloses the cross-section, CB, of the encapsulant symmetrically with respect to the radial direction, R, such that the reflector defines first and second openings arranged opposite each other with respect to the cross section, CB. Hence, seen from the cross-section, CB, of the encapsulant of the LED filament, the centers of the first and second openings are separated by an angle of 180°. The present embodiment is advantageous in that the form of the two (elongated) openings may even further contribute to the attractiveness of the LED filament light and/or desired properties of the LED light emission. For example, in this case of two (elongated) openings of the reflector, the LED filament may achieve a dual (opposite) side LED light emission.

According to an embodiment of the present invention, the LED filament may comprise a sub-encapsulant at least partially enclosing at least one of the at least one array of the plurality of LEDs, wherein the sub-encapsulant comprises a light-transmissive material. In other words, the encapsulant of the LED filament may at least partially enclose the sub-encapsulant, which in turn may at least partially enclose one or more of the array(s) of the plurality of LEDs, wherein the sub-encapsulant comprises a material, composition and/ or substance which is configured to transmit (i.e. transfer) light. The present embodiment is advantageous in that the sub-encapsulant may even further contribute to the desired properties of the LED filament light.

According to an embodiment of the present invention, at least one of the encapsulant and the sub-encapsulant of the LED filament comprises at least one of a luminescent material configured to at least partly convert the LED light emitted from the plurality of LEDs into converted light, and a light scattering material configured to scatter the LED light emitted from the plurality of LEDs. Hence, the encapsulant and/or the sub-encapsulant, which comprise(s) a light-transmissive material, further comprises a luminescent material configured to at least partly convert the LED light emitted from the plurality of LEDs into converted light and/or a light scattering material configured to scatter the LED light emitted from the plurality of LEDs.

According to an embodiment of the present invention, the LED filament may further comprise a carrier arranged to support the plurality of LEDs, wherein the encapsulant at least partially encloses the carrier and wherein the carrier is at least one of light transmissive and reflective. Hence, the carrier (e.g. a substrate), which is arranged to (mechanically and electrically) support the plurality of LEDs, may be at least partially enclosed by the encapsulant. Furthermore, the carrier may be light transmissive and/or reflective. The present embodiment is advantageous in that at least a portion of the LED light may be transmitted through the carrier, thereby further contributing to the lighting properties and/or decorative appearance of the LED filament.

According to an embodiment of the present invention, the LED filament may elongate in, at least one of, a meandering shape in a plane, P, a spiral shape, and a helix shape. Hence, the LED filament may elongate in the meandering shape, the spiral shape and/or the helix shape according to the above. By "meandering shape", it is here meant an "S" shape, "snake" shape, or the like, wherein the LED filament elongates by this shape in a plane, P. By "spiral shape", it is here meant that the LED filament elongates in a coil or corkscrew shape. By "helix shape", it is here meant that the LED filament may be twisted around its own axis, i.e. around the axis, A. It should be noted that any combination of the above-mentioned examples may be feasible, such as a combination of the spiral shape and the helix shape. The present embodiment is advantageous in that the configuration(s) of the LED filament in the LED filament may achieve an effectful emission of the LED filament light and achieve a decorative LED filament during operation thereof.

According to an embodiment of the present invention, the cross-section, CB, of the LED filament may comprise a first central axis, C, intersecting a center, CP, of the cross-section, CB, and the at least one opening. The LED filament may further comprise a second central axis, B, perpendicular to the first central axis, C, wherein the carrier is arranged parallel to the second central axis, B, and has a width, Ws. The at least one opening has a width, G, parallel to the second central axis, B, and the width, G, of the at least one opening and the width, Ws, of the carrier, fulfill G<0.5·Ws. Hence, the LED filament may comprise a carrier for supporting the LEDs of the array(s), wherein the carrier is arranged in parallel with the opening(s) and the width of the opening(s), G, is less than half the width, Ws, of the carrier. Preferably, G<0.4·Ws, and even more preferred, G<0.3·Ws. The present embodiment is advantageous in that the relatively narrow opening(s) may allow the LED filament to direct the LED light in specific directions and/or that a higher degree of reflection is achieved before the light is emitted from the LED filament.

According to an embodiment of the present invention, the cross-section, CB, of the LED filament, comprises a first central axis, C, intersecting a center, CP, of the cross-section, CB, and the at least one opening. The cross-section, CB, further comprises a second central axis, B, perpendicular to the first central axis, C. The at least one opening has a width, G, parallel to the second central axis, B, and the at least one array is arranged at a distance, D, from the first central axis, C, along the second central axis, B, wherein D>G/2. In other words, the array(s) of LEDs is (are) arranged offset from the first central axis, C, by a distance, D, and the distance, D, is larger than half the width, G, of the opening(s). By this construction of the LED filament, the concept of the light cavity of the present invention is even further increased, as the array(s) of LEDs is (are) enclosed by the reflector to an even higher extent. The LED filament may hereby allow a relatively large portion of the LED light to be reflected via the reflector before the light is emitted from the LED filament.

According to an embodiment of the present invention, the cross-section, CB, of the LED filament, comprises a first central axis, C, intersecting a center, CP, of the cross-section, CB, and the at least one opening. The cross-section, CB, further comprises a second central axis, B, perpendicular to the first central axis, C. A height, He, of the encapsulant from the center, CP, to the at least one opening along the first central axis, C, and a width, W, of the LED filament along the second central axis, B, fulfills He<W. Hence, the height, He, of the encapsulant is smaller than the width, W, of the LED filament.

According to an embodiment of the present invention, the first reflectivity, $R_1$, of the elongated reflector may fulfill $R_1>70\%$. Hence, the reflector may have a relatively large reflectivity for reflecting the LED light.

According to an embodiment of the present invention, the LED filament may comprise at least one diffuser arranged on the at least one opening, wherein the at least one diffuser has a second reflectivity, $R_2$, wherein $R_2<R_1-20\%$ is fulfilled. By the term "diffuser", it is here meant substantially any element, material, etc., which is arranged to diffuse the light incident thereon. Hence, by the present embodiment, the second reflectivity, $R_2$, is smaller than the first reflectivity, $R_1$. The diffuser provided on the opening(s) is hereby partially reflective, i.e. semi-reflective, and may, for example, have a reflectivity in the range from 30% to 80% for the visible light, Hence, the opening(s) provided with the diffuser according to the embodiment is advantageous in in that some of the light incident on the opening(s) will be reflected back, leading to an even more improved mixing of the LED light before the LED light exits the LED filament via the opening(s) of the reflector.

According to an embodiment of the present invention, there is provided a lighting device. The lighting device may comprise a LED filament according to any one of the preceding embodiments, and a cover comprising an at least partially light-transmissive material, wherein the cover at least partially encloses the LED filament. The lighting device may further comprise an electrical connection connected to the LED filament for a supply of power to the plurality of LEDs of the LED filament.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
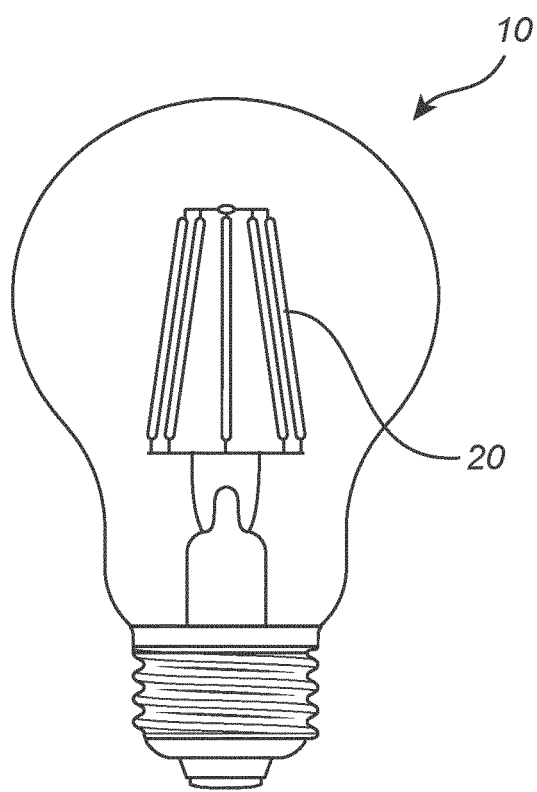
FIG. 1 shows a LED filament lamp according to the prior art.

FIG. 1 shows a LED filament lamp 10 according to the prior art, comprising a plurality of LED filaments 20. LED filament lamps 10 of this kind are highly appreciated as they are very decorative, as well as providing numerous advantages compared to incandescent lamps such as a longer operational life, a reduced power consumption, and an increased efficiency related to the ratio between light energy and heat energy. LED filament lamps 10 of this kind are able to produce warm white light. However, it is of interest to improve the properties of the light emitted from the LED filaments 20 without impairing the appearance and/or the decorative aspect of the LED filaments 20 and/or the LED filament lamps 10.

Figure 2:
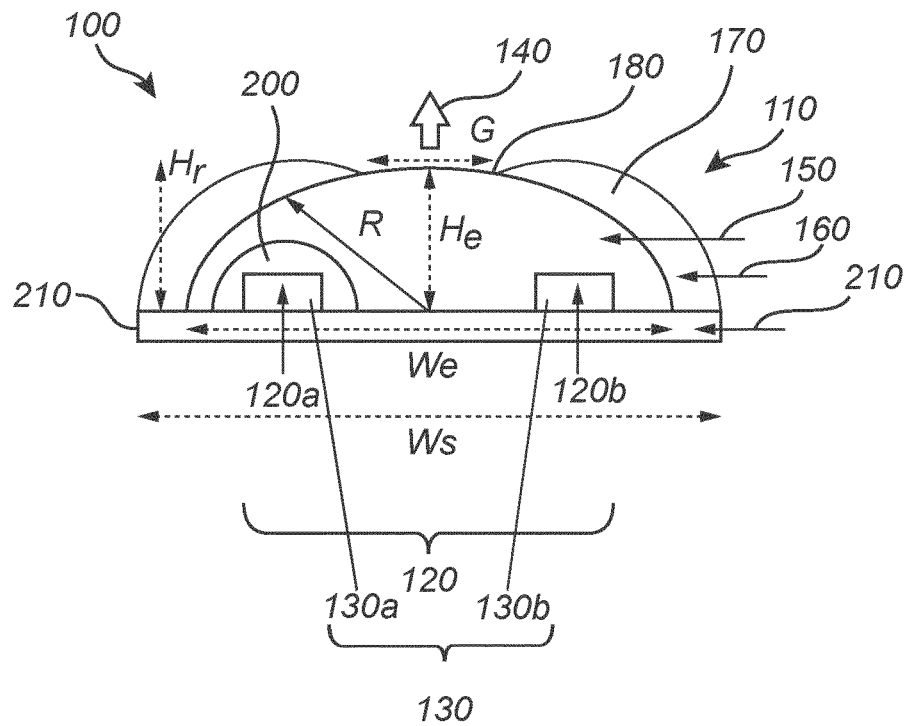
FIG. 2 shows a LED filament according to an exemplifying embodiment of the present invention.
Figure 2:
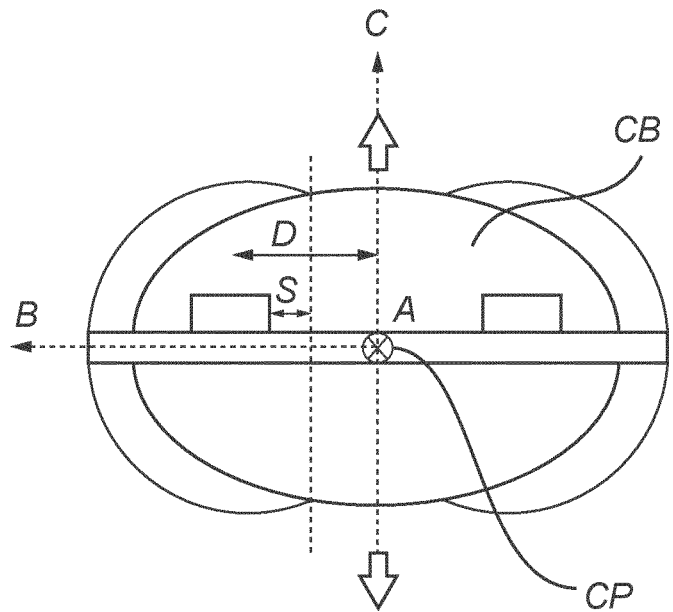

FIG. 2 shows a LED filament 110 according to an exemplifying embodiment of the present invention. The LED filament 110 is arranged to emit LED filament light 140. The LED filament 110 comprises a LED filament 110 which elongates along an axis, A, and FIG. 2 hereby shows the LED filament 110 in a cross-section, perpendicular to the axis, A. The LED filament 110 comprises two arrays 120 of a plurality of LEDs 130 arranged to emit LED light 140, but it should be noted that the LED filament 110 may comprise substantially any number of array(s) 120, such as a (single) array of LEDs, a plurality of arrays of LEDs, etc. The plurality of LEDs 130 preferably comprises more than 5 LEDs, more preferably more than 8 LEDs, and even more preferred more than 10 LEDs. The plurality of LEDs 130 may be direct emitting LEDs which provide a color. Preferably, the LED filament 120 has a length, L, (not shown) and a width, W, (not shown) wherein L>5W.

In the example of the LED filament 110 in FIG. 2, the LED filament 110 comprises a first array 120a of a first plurality of LEDs 130a, and analogously, a second array 120b of a second plurality of LEDs 130b. Hence, the LED filament 110 comprises two columns of LEDs 130a, 130b. The first and second plurality of LEDs 130a, 130b may be of the same type or may differ from each other by one or more properties. For example, the first array 120a of the first plurality of LEDs 130a may be configured to emit light with a first color temperature, $CT_1$, and the second array 120b of the plurality of second LEDs 130b may be configured to emit light with a second color temperature, $CT_2$, wherein the first and second color temperatures differ, i.e. $CT_1 \neq CT_2$. Preferably, $CT_2-CT_1>300$ K, more preferred $CT_2-CT_1>700$ K, and even more preferred $CT_2-CT_1>900$ K.

According to another example, the first array 120a of the plurality of first LEDs 130a may be configured to emit light with a first color temperature, $CT_1$, and the second array 120b of the plurality of second LEDs 130b may comprise a plurality of red, green, blue (and white) LEDs, i.e. RGB(W) LEDs.

The LED filament 110 further comprises an encapsulant 150. The encapsulant 150, which has an elongated shape and comprises a light-transmissive material, encloses the arrays 120 of the plurality of LEDs 130. The cross section, CB, of the LED filament 110, and in this case also the encapsulant 150 may, for example, have an oval shape. The cross-section, CB, of the encapsulant 150 perpendicular to the axis, A, may be semi-circular or circular. The encapsulant 150 may be a polymer material which may be flexible such as for example a silicone. The encapsulant 150 may comprise a luminescent material that is configured to at least partly convert the LED light into converted light. The luminescent material may be a light-scattering material, e.g. a polymer matrix comprising $BaSO_4$, $Al_2O_3$ and/or $TiO_2$ particles. The luminescent material may be a phosphor such as an inorganic phosphor (e.g. YAG, LuAG, ECAS, KSiF, etc.) and/or quantum dots or rods. The phosphor may further be e.g. a (blue) green/yellow and/or red phosphor. The luminescent material may hereby be configured to convert e.g. UV LED light into blue converted light and/or UV/blue LED into green/yellow and/or red converted light. Although not shown in FIG. 2, a thickness of the encapsulant 150 and/or a concentration of the luminescent material in the encapsulant 150 may vary over the length of the LED filament 110 along the axis, A.

The LED filament 110 further comprises a sub-encapsulant 200 which at least partially encloses the first array 120a of the first plurality of LEDs 130a. The sub-encapsulant 200, which comprises a light-transmissive material, may differ from the material of the encapsulant 150. It should be noted that the second array 120b of the second plurality of LEDs 130b may also comprise a sub-encapsulant, which furthermore may comprise the same, or a different, material as that of the sub-encapsulant 200.

The LED filament 110 in FIG. 2 further comprises an elongated reflector 160 which extends along the elongated LED filament 110. The reflector 160 is arranged to reflect the LED light emitted from the array(s) 120 of the plurality of LEDs 130 of the LED filament 110 during operation. Seen in the cross-section, CB, of the LED filament 110, the reflector 160 partially encloses the encapsulant 150 perpendicular to the axis, A, of the LED filament 110 in a radial direction, R. The reflector 160 defines one or more openings 180 along the LED filament 110, wherein the encapsulant 150 is not covered by the reflector 150 along the opening(s) 180. As exemplified in the upper part of FIG. 2, the reflector 160 defines a (single) opening 180 (upwards) and elongates along the axis, A, of the LED filament 110. By this, there is a single side emission of LED filament light 140 from the LED filament 110. As exemplified in the lower part of FIG. 2, the reflector 160 defines two openings 180 (upwards and downwards) which elongate along the axis, A, of the LED filament 110. By this, there is a dual (opposite) side emission of LED filament light 140 from the LED filament 110. The elongated reflector 160 may comprise reflective particles and/or flakes in a polymer material/matrix. The reflector 160 and/or the polymer material/matrix may be flexible. For example, the polymer may be a silicone material. Furthermore, the first reflectivity, $R_1$, of the elongated reflector may fulfill $R_1>70\%$, more preferred $>80\%$, and even more preferred $>85\%$.

In FIG. 2, the LED filament 110 comprises a carrier 210 arranged to support the array(s) 120 of the plurality of LEDs 130. Preferably, the LEDs 130 are arranged on an elongated carrier 210 like for instance a substrate, that may be rigid (made from e.g. a polymer, glass, quartz, metal or sapphire) or flexible (e.g. made of a polymer or metal, e.g. a film or (polyimide) foil). The carrier 210 may be monolithic and may have electrical tracks. In case the carrier 210 comprises a first major surface and an opposite second major surface, the array(s) 120 of the plurality of LEDs 130 may be arranged on at least one of these surfaces. The encapsulant 150 at least partially encloses the carrier 210. The carrier 210 may be reflective and/or light transmissive, such as translucent and preferably transparent. For example, the carrier 210 may have a reflectivity which is larger than e.g. 80% and/or a light transmission which is larger than e.g. 50%.

The LED filament 110 as exemplified in FIG. 2 may have certain preferable dimensions according to the following. The cross-section, CB, of the LED filament 110 (and hereby, also of the encapsulant 150) of the LED filament 110 may comprise a first central axis, C, intersecting a center, CP, of the cross-section, CB, and the opening(s) 180 of the reflector 160. The LED filament 110 may further comprise a second central axis, B, perpendicular to the first central axis, C. The carrier 210 is arranged parallel to (along) the second central axis, B, and has a width, Ws. The opening(s) 180 has a width, G, parallel to the second central axis, B, and the width, G, of the opening(s) 180 and the width, Ws, of the carrier 210, fulfill $G<0.5 \cdot Ws$. For example, $Ws<10$ mm, and consequently, $G<5$ mm, although it is even more preferred that $G<3$ mm. Furthermore, the array(s) 120 of the plurality of LEDs 130 is arranged at a distance, D, from the first central axis, C, parallel to (along) the second central axis, B, wherein $D>G/2$. Preferably, $D>3 \cdot G/4$, and even more preferred, $D>G$. Furthermore, a height, He, of the encapsulant 150 from the center, CP, to the opening(s) 180 of the reflector 160 along the first central axis, C, and a width, W, of the LED filament 110 along the second central axis, B, fulfill $He<W$. Preferably, $He<3 \cdot W/4$, and even more preferred, $He<W/2$.

Figure 3A:
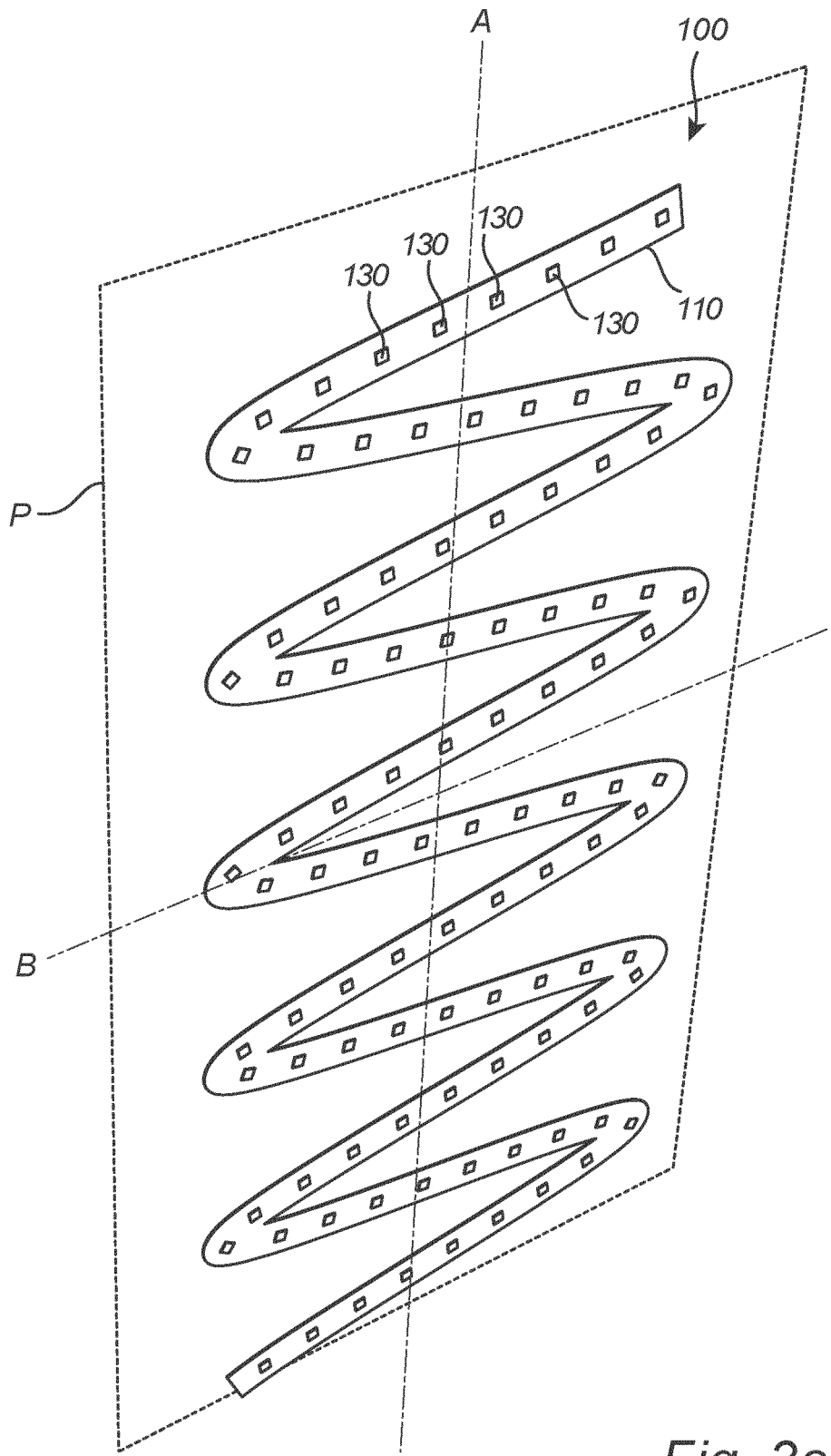
FIGS. 3a-3c show LED filaments of a LED filament arrangement according to exemplifying embodiments of the present invention.
Figure 3B:
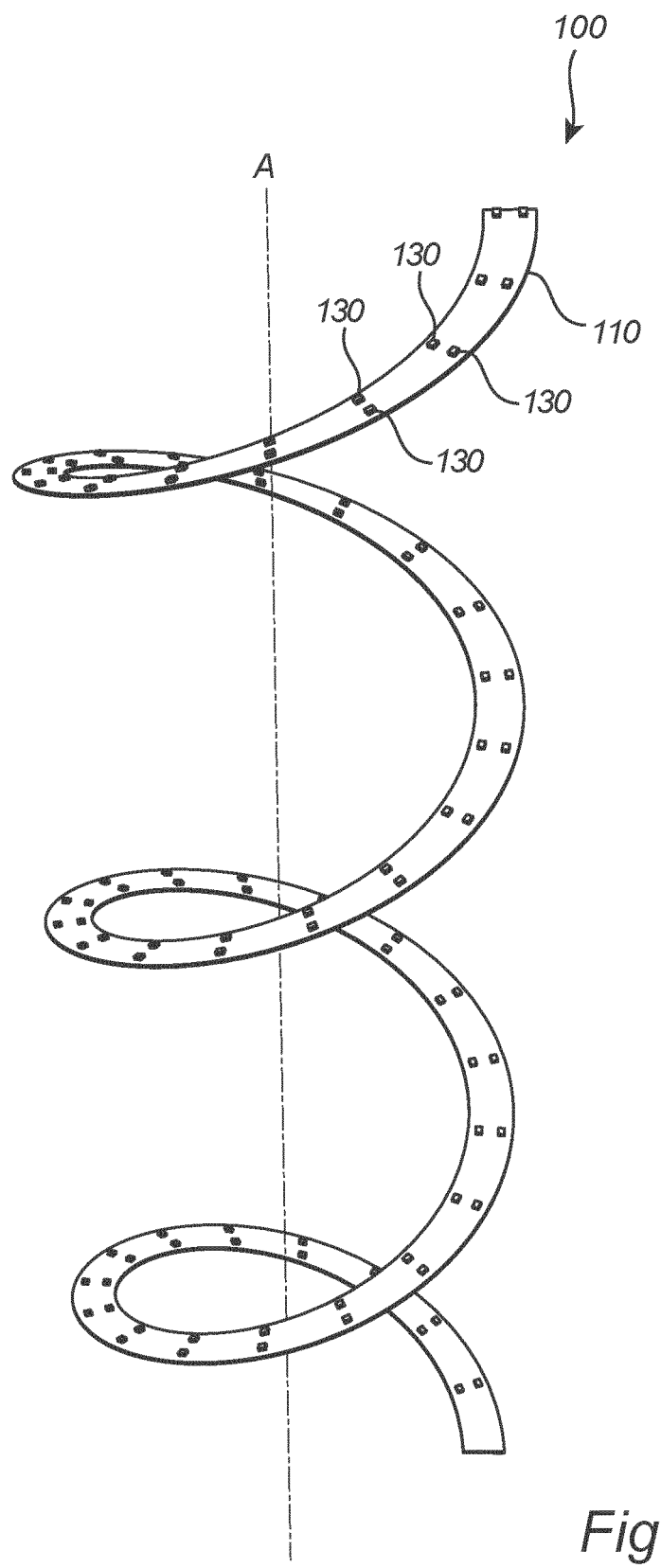
Figure 3C:
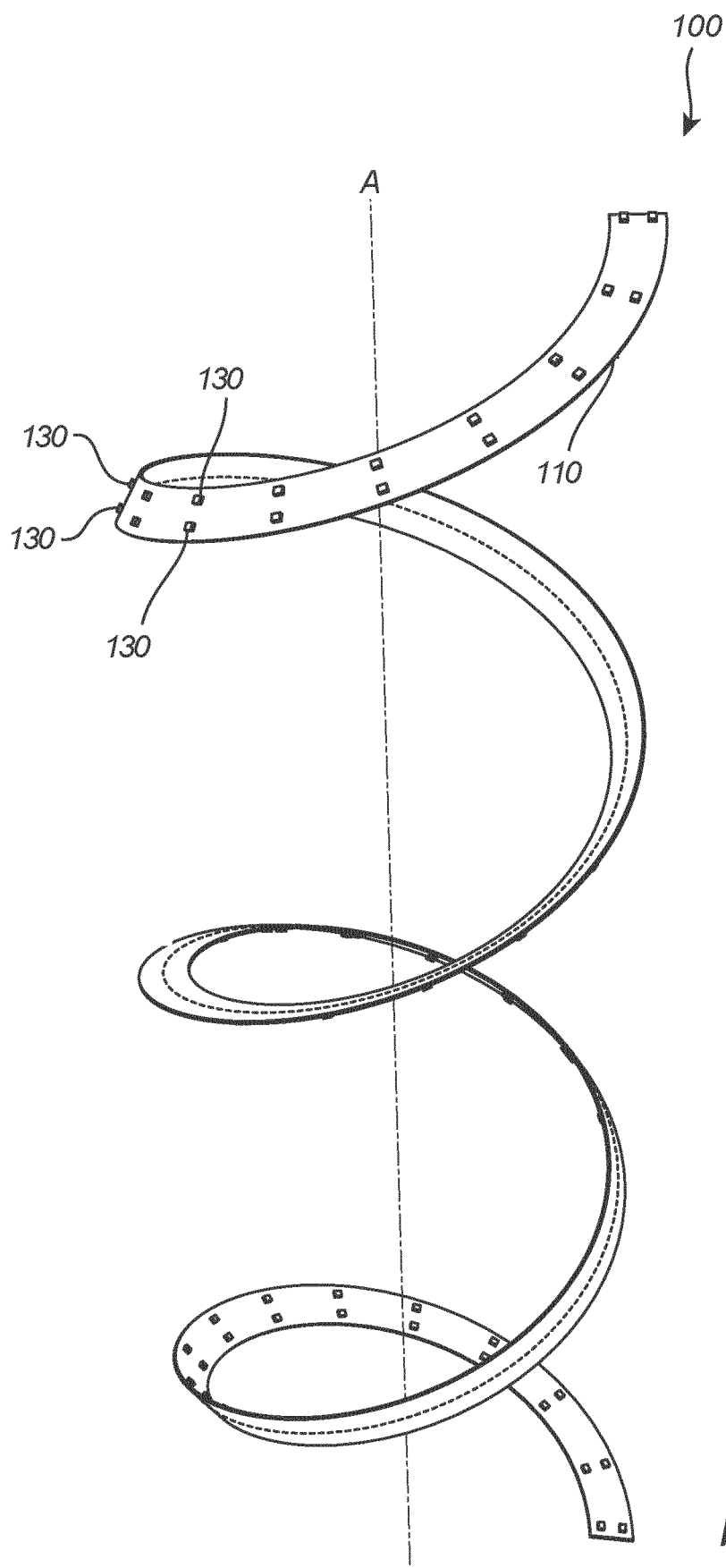

FIGS. 3a-3c show LED filaments 110 of a LED filament arrangement 100 according to exemplifying embodiments of the present invention. More specifically, FIGS. 3a-3c show different geometric examples or configurations of the LED filament 110 in FIG. 2, and it is referred to FIG. 2 and the associated text for an increased understanding of the components and/or functions of the LED filament 110 and/or LED filament arrangement 100.

In FIG. 3a, the LED filament 110, comprising a plurality of LEDs 130, of the LED filament arrangement 100 elongates in a meandering shape in a plane, P, spanned by the axes A and B. Hence, according to this example, the LED filament 110 elongates in an "S" shape, "snake" shape, or the like, in the plane, P.

In FIG. 3b, the LED filament 110, comprising a plurality of LEDs 130, of the LED filament arrangement 100 elongates in a spiral shape. Hence, according to this example, the LED filament 110 elongates in a coil or corkscrew shape, and the plurality of LEDs 130 is arranged to emit light essentially in an (upwards) vertical direction with respect to the presentation (orientation) of the LED filament 110 in FIG. 3a.

In FIG. 3c, the LED filament 110, comprising a plurality of LEDs 130, of the LED filament arrangement 100 elongates in a helix shape, wherein the LED filament is twisted with respect to the axis, A. Hence, according to this example, in which the LED filament is twisted around its own axis, i.e. around the axis, A, the plurality of LEDs 130 is arranged to emit light upwards, downwards and/or sideways with respect to the presentation (orientation) of the LED filament 110 in FIG. 3a.

Figure 4:
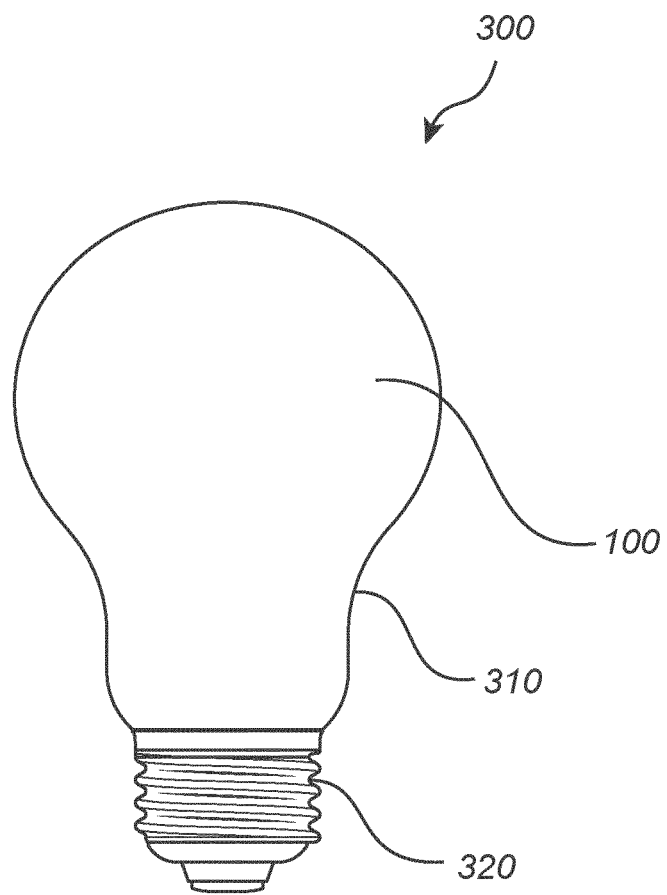
FIG. 4 shows LED lighting devices comprising a LED filament arrangement according to an exemplifying embodiment of the present invention.

FIG. 4 schematically shows a lighting device 300 according to an embodiment of the present invention. The lighting device 300, which may constitute a lamp or a luminaire, comprises a LED filament arrangement 100 or the LED filament 110 according to any one of the previously described embodiments. The lighting device 300 further comprises a cover 310, which is exemplified as being bulb-shaped. The cover 310 may comprise an at least partially light transmissive (e.g. transparent) material and at least partially encloses the LED filament arrangement 100 or the LED filament 110. The lighting device 300 further comprises an electrical connection 320 connected to the LED filament arrangement 100 or the LED filament 110 for a supply of power to the plurality of LEDs of the LED filament arrangement 100 or the LED filament 110.

The person skilled in the art realizes that the present invention by no means is limited to the preferred embodiments described above. On the contrary, many modifications and variations are possible within the scope of the appended claims. For example, one or more of the LED filament 110, the encapsulant 150, the reflector 160, etc., may have different shapes, dimensions and/or sizes than those depicted/described.

The invention claimed is:

1. A light emitting diode, LED, filament arranged to emit LED filament light, comprising
an elongated axis, A,
at least one array of a plurality of light emitting diodes, LEDs, arranged to emit LED light,
an encapsulant enclosing the at least one array of the plurality of LEDs, wherein the encapsulant comprises a light-transmissive material,
a carrier arranged to support the plurality of LED's, wherein the encapsulant at least partially encloses the carrier and wherein the carrier is at least one of light transmissive and reflective,
wherein the LED filament further comprises
an elongated reflector having a first reflectivity, $R_1$, arranged to reflect the LED light, wherein the reflector, by partially enclosing a cross-section, CB, perpendicular to the axis, A, of the LED filament in a radial direction, R, partially encloses the encapsulant along the LED filament and is in direct contact with the encapsulant and the carrier, whereby the reflector defines at least one opening along the LED filament, wherein the encapsulant is not covered by the reflector along the at least one opening.

2. The LED filament according to claim 1, comprising
at least one first array of a plurality of first LEDs configured to emit light with a first color temperature, $CT_1$, and
at least one second array of a plurality of second LEDs, wherein said second array is configured to emit light with a second color temperature, $CT_2$, with $CT_1 \neq CT_2$, or said second array comprising a plurality of red LEDs, a plurality of green LEDs and a plurality of blue LEDs.

3. The LED filament according to claim 1, wherein the at least one opening is an elongated opening arranged along at least a portion of a length of the LED filament.

4. The LED filament according to claim 1, wherein the reflector, by partially enclosing the cross-section, CB, of the encapsulant in the radial direction, R, and symmetric with respect to the radial direction, R, defines a first opening and a second opening, wherein the second opening is arranged opposite the first opening.

5. The LED filament according to claim 1, comprising a sub-encapsulant at least partially enclosing at least one of the at least one array of the plurality of LEDs, wherein the sub-encapsulant comprises a light-transmissive material.

6. The LED filament according to claim 5, wherein at least one of the encapsulant and the sub-encapsulant comprises at least one of a luminescent material configured to at least partly convert the LED light emitted from the plurality of LEDs into converted light, and a light scattering material configured to scatter the LED light emitted from the plurality of LEDs.

7. The LED filament according to claim 1, wherein the LED filament elongates in, at least one of,
a meandering shape in a plane, P,
a spiral shape, and
a helix shape.

8. The LED filament according to claim 1, wherein the cross-section, CB, of the LED filament, comprises
a first central axis, C, intersecting a center, CP, of the cross-section, CB, and the at least one opening, and
a second central axis, B, perpendicular to the first central axis, C,
wherein the carrier is arranged parallel to the second central axis, B, and has a width, Ws, wherein the at least one opening has a width, G, parallel to the second central axis, B, and wherein the width, G, of the opening and the width, Ws, of the carrier, fulfill $G < 0.5 \cdot Ws$.

9. The LED filament according to claim 1, wherein the cross-section, CB, of the LED filament, comprises
a first central axis, C, intersecting a center, CP, of the cross-section, CB, and the at least one opening, and
a second central axis, B, perpendicular to the first central axis, C,
wherein the at least one opening has a width, G, parallel to the second central axis, B, and wherein the at least one array is arranged at a distance, D, from the first central axis, C, along the second central axis, B, wherein $D > G/2$.

10. The LED filament according to claim 1, wherein the cross-section, CB, of the LED filament, comprises
a first central axis, C, intersecting a center, CP, of the cross-section, CB, and the at least one opening, and
a second central axis, B, perpendicular to the first central axis, C,
wherein a height, He, of the encapsulant from the center, CP, to the at least one opening along the first central axis, C, and a width, W, of the LED filament along the second central axis, B, fulfills $He < W$.

11. The LED filament according to claim 1, wherein the first reflectivity, $R_1$, of the elongated reflector fulfills $R_1>70\%$.

12. The LED filament according to claim 1, comprising at least one diffuser arranged on the at least one opening, wherein the at least one diffuser has a second reflectivity, $R_2$, wherein $R_2<R_1-20\%$ is fulfilled.

13. A lighting device, comprising
- a LED filament arrangement having a LED filament according to claim 1,
- a cover comprising an at least partially light-transmissive material, wherein the cover at least partially encloses the LED filament arrangement, and
- an electrical connection connected to the LED filament arrangement for a supply of power to the plurality of LEDs of the LED filament arrangement.

* * * * *